(12) United States Patent
Bilhöfer et al.

(10) Patent No.: US 10,723,200 B2
(45) Date of Patent: Jul. 28, 2020

(54) CONTROLLER FOR AN ELECTRIC HEATING DEVICE AND METHOD FOR PRODUCING SAME

(71) Applicant: Eberspächer catem GmbH & Co. KG, Herxheim (DE)

(72) Inventors: Andreas Bilhöfer, Schifferstadt (DE); Bohlender Franz, Kandel (DE); Albert Reger, Grafenau (DE); Andreas Schwarzer, Frankfurt (DE); Daniela Weber, Zeiskam (DE)

(73) Assignee: Eberspächer catem GmbH & Co. KG, Herxheim (DE)

( * ) Notice: Subject to any disclaimer, the term of this patent is extended or adjusted under 35 U.S.C. 154(b) by 500 days.

(21) Appl. No.: 15/322,879

(22) PCT Filed: Jun. 25, 2015

(86) PCT No.: PCT/EP2015/064456
§ 371 (c)(1),
(2) Date: Dec. 29, 2016

(87) PCT Pub. No.: WO2016/005205
PCT Pub. Date: Jan. 14, 2016

(65) Prior Publication Data
US 2017/0151858 A1    Jun. 1, 2017

(30) Foreign Application Priority Data

Jul. 8, 2014 (EP) .................................. 14002346

(51) Int. Cl.
*H05B 1/02* (2006.01)
*B60H 1/22* (2006.01)
(Continued)

(52) U.S. Cl.
CPC ........... *B60H 1/2215* (2013.01); *B60R 16/02* (2013.01); *F24H 3/0405* (2013.01);
(Continued)

(58) Field of Classification Search
CPC ..... B60H 1/2215; B60K 16/02; F24H 3/0405; F24H 9/1863; H05B 3/43; H05B 1/02;
(Continued)

(56) References Cited

U.S. PATENT DOCUMENTS

| 2004/0084431 | A1* | 5/2004 | Uhl ....................... | B60H 1/2225 219/201 |
| 2005/0173394 | A1* | 8/2005 | Bohlender ............. | H01H 37/76 219/202 |

(Continued)

FOREIGN PATENT DOCUMENTS

| CN | 101170873 A | 4/2008 |
| CN | 102348332 A | 2/2012 |

(Continued)

*Primary Examiner* — Mark H Paschall
(74) *Attorney, Agent, or Firm* — Boyle Fredrickson S.C.

(57) ABSTRACT

A controller for an electric heating device comprising a support element and a busbar which is secured on the support element and which is connected to an SMD component in an electrically conductive manner. The busbar is part of an initially single-part stamped metal plate with a severed connecting piece, which separates the metal plate into a supply element and a discharge element, the elements being connected together in an electrically conductive manner solely via the SMD component. Also disclosed is a method of producing an electric heating device generally as described above such that the supply element and the discharge element are produced from the supply element region and the discharge element region on the stamped metal plate, respectively.

13 Claims, 5 Drawing Sheets

(51) Int. Cl.
  *H05B 3/42* (2006.01)
  *F24H 9/18* (2006.01)
  *F24H 3/04* (2006.01)
  *B60R 16/02* (2006.01)
  *H02G 3/04* (2006.01)
  *H02G 5/10* (2006.01)
  *H05K 3/20* (2006.01)
  *H01L 23/34* (2006.01)

(52) U.S. Cl.
  CPC ............ *F24H 9/1863* (2013.01); *H02G 3/04* (2013.01); *H02G 5/10* (2013.01); *H05B 1/02* (2013.01); *H05B 3/42* (2013.01); *H01L 23/34* (2013.01); *H01L 23/345* (2013.01); *H01L 2924/0002* (2013.01); *H05B 2203/011* (2013.01); *H05B 2203/017* (2013.01); *H05B 2203/02* (2013.01); *H05B 2203/023* (2013.01); *H05K 3/202* (2013.01)

(58) Field of Classification Search
  CPC .. H05B 2203/017; H05B 3/12; H05B 1/0236; H05B 3/0042; H05K 3/202

USPC ....... 219/504, 505, 501, 507, 494, 202, 208, 219/541, 548

See application file for complete search history.

(56) References Cited

U.S. PATENT DOCUMENTS

| | | | | |
|---|---|---|---|---|
| 2009/0020619 A1* | 1/2009 | Bohlender | ............ | F24H 3/0405 237/12.3 C |
| 2010/0243638 A1* | 9/2010 | Niederer | ............. | H01R 13/113 219/542 |
| 2012/0248091 A1* | 10/2012 | Bohlender | ............. | F24H 1/009 219/540 |

FOREIGN PATENT DOCUMENTS

| | | |
|---|---|---|
| DE | 196 04 614 A1 | 8/1997 |
| EP | 0 590 644 A1 | 4/1994 |
| EP | 1 395 098 A1 | 3/2004 |
| EP | 2 043 412 A1 | 4/2009 |

* cited by examiner

CONTROLLER FOR AN ELECTRIC HEATING DEVICE AND METHOD FOR PRODUCING SAME

BACKGROUND OF THE INVENTION

1. Field of the Invention

The present invention relates to a controller for an electric heating device and a method for producing the same.

2. Discussion of the Related Art

The present invention relates in particular to a controller for an electric heating device with the features according to the preamble of claim 1. Such a controller is for example known from EP 2 043 412 A1. This controller comprises a circuit board and a busbar, which is secured on this support element and which is connected to an SMD component in an electrically conductive manner.

The SMD component usually is a power semiconductor switch producing power loss. This power loss needs to be continuously discharged. Thus, the busbar of the aforementioned prior art also constitutes a heat sink, which is connected to a separate heat sink, the cooling ribs of which essentially protrude perpendicularly from the support element. The SMD component is arranged on one side of the support element, the heat sink on the other side.

The applicant knows a plurality of solutions on how, also by taking into account the necessary discharge of the thermal loss, the busbar may be configured in order to meet practical requirements. Such solutions are for example known from DE 10 2005 038 862 A1, JP 2001-319708, DE 195 18 522 A1, EP 1 395 098 A1, CN 2727957 Y, DE 199 35 803 A1, DE 10 2004 061 936 A1, EP 0 901 166 A1, U.S. Pat. No. 6,442,033 B1.

The previously known solution from EP 2 043 412 A1 is unfavorable in terms of thermal technology, since due to the arrangement of the SMD component, the thermal conduction distance up to the cooling ribs is relatively long. Moreover, producing is complex and cost-intensive. Finally, the solution is unsatisfactory, since the power flow exclusively is conducted via a single busbar. The circuit board, however, only has a limited capacity for transmitting high power flows.

Specifically, the last-mentioned aspect is important for controllers for electric heating devices, since relatively high power flows are controlled or switched there. Furthermore, the present invention in particular aims to provide a controller for an electric heating device in a motor vehicle. Such electric heating devices and their controllers require specific safety standards. The operating conditions in a motor vehicle further require a very good and solid contacting of all components involved. Vibrations, cold differences, as well as where appropriate humid and contaminated atmosphere, especially require a good contacting and a solid transmission of the power flow. Contact resistances in the conductive track of the power flow often lead to a local heating, which may lead to the alloying of the SMD component. A thermal event may lead to smoldering of the entire controller or the entire heating device.

SUMMARY OF THE INVENTION

The aim of the present invention is to provide a controller with improved electric conductive tracks for the power flow. Said controller being producible in an economical manner and, thus, the present invention aims also to provide a corresponding method for producing such a controller.

To solve the problem underlying the device, the present invention provides a controller with the features of claim 1. Said controller differs from the aforementioned prior art in that the busbar is part of an initially single-part stamped metal plate. The stamped metal plate has at least one severed connecting piece. This connecting piece separates the metal plate into a supply element and a discharge element. The supply element and the discharge element are connected to one another in an electrically conductive manner solely via the SMD component. Apart from that, the supply element and the discharge element, however, are provided electrically insulated from one another and are usually both secured on the support element in order to provide a predetermined spatial distance of the two conducting elements. The supply element and/or the discharge element, thereby, are usually such conducting elements of the controller, which transmit the power flow of an electric heating device. Thereby, the electric heating device usually has a power consumption of several thousand watts, in particular between 1000 and 3000 watts. In case of an assumed vehicle electrical system voltage of 12 Volt in a vehicle, correspondingly, high cable cross-sections are required. Said cable cross-sections are provided by stamped supply and discharge elements.

Insofar as the present invention refers to the supply and the discharge, this only occurs in order to terminologically distinguish the elements. Thereby, it is not intended to provide a mandatory determination in which direction the current is to flow relative to the respective elements and in view of the SMD component.

The severed connecting piece can be recognized at the finished product with its separating and cutting edges, which are provided essentially opposite to the individual current conduction elements. According to the present invention, it is in fact not required to separate the connection pieces only after joining of the metal plate with the support element. In case of such a preferred embodiment, stamping openings in the support element are usually provided for each severed connection piece, which are located behind the respective connecting pieces of the single-part stamped metal plate. Thus, for the purpose of an adequate representation, at least the preferred solution of the invention may refer to such stamping openings and not to the severed connection pieces.

By means of the solution according to the invention, essentially two busbars are formed, namely on the one hand, the supply element, on which the SMD component usually is directly arranged and electrically bonded to said SMD component, as well as the discharge element, which is electrically connected to the SMD component, for example via at least one contact base protruding laterally on the SMD component. Thus, the power flow is not only supplied directly to the SMD component through the supply element. The power flow is also discharged via a further busbar formed by the discharge element.

The two busbars are economically producible by initially stamping said busbars as regions in a uniformly stamped metal plate with a connecting piece that connects the two regions to one another. Thereby, due to the at least one connecting piece, the two regions remain in a predetermined spatial allocation to one another. They are usually located in one plane. A connecting piece in the meaning of the present invention has an essentially lower width than the side surfaces of the busbar, which are surpassed by said connecting piece. This allows the SMD component to be easily applied by means of the SMD placement technology. The SMD component is usually surface mounted on the supply element. The contact base is surface mounted on the discharge element. Thereafter, the uniform configuration of the metal plate is suspended by severing the connecting piece or pieces. Thus, from the initially single-part metal plate, conductive tracks provided for power flow to be switched by the SMD component are formed insulated from one another, i.e. spaced apart from one another. Since the contact base is usually not well-suited for the mechanical support of the discharge element, the connecting piece is usually only severed after the supply element and the discharge element have been connected to the support element. The connecting to the support element may occur in different ways, for example by means of gluing and/or interlocking.

It goes without saying that the support element is usually an insulating element so that the application of both conducting elements does not lead to any short-circuit between these two elements. The support element is usually formed from plastic and is an injection-molded part, usually made of a thermally high-grade thermoplastic. The support element is usually not a printed circuit board, which is equipped with components. In view of a possible cost-saving production, the support element, however, merely is an injection-molded plastic plate.

Said plastic plate may comprise detent lugs for interlocking the supply element and the discharge element. Said support element may as well be provided with a pin protruding from an abutment plane for the supply element and the discharge element, which pin penetrates a bore recessed in the supply element or the discharge element. The free ends of these pins may serve the final securement of the supply element or the discharge element on the support element by means of warm caulking.

Regarding the electric controller according to the invention, accordingly, the supply element and the discharge element are usually secured to the supply element in an electrically insulating manner. As the above presentation of the invention shows, the controller can be produced cost-effectively. It offers busbars for the supply and discharge of power flow and, thus, an improved transmission of the power flow by means of the controller. The stamping of the metal plate with the subsequent severing of the connecting piece allows an easy production of the two busbars. If the connecting piece is severed only after the mounting of the SMD component and the bonding on the two busbars, a positioning of the busbars relative to one another for the bonding may be dispensed with, since the spatial allocation of the supply region and the discharge region is fixed by the connecting pieces. The controller according to the invention usually does not have a conventional printed circuit board.

According to a preferred embodiment of the present invention, the SMD component is directly bonded electrically to the supply element, i.e. rests on the supply element and is screwed therewith, however, in particular soldered. Moreover, the supply element is configured as a heat sink, i.e. is located in the thermal conduction path between the SMD component as a heat source and a surface flowed by a fluid for the heat transmission and discharge of the power loss. This surface provided for the heat transmission is preferably formed by the supply element itself. Thus, it may be dispensed with applying a separate cooling element. Regarding this preferred embodiment, the supply element alone forms the surface necessary for the heat transmission and discharge.

By means of stamping or stamping-bending the metal plate, the effective surface for the discharge of the power loss can be increased. Thus, by stamping cooling ribs extending in the plane of the metal plate may be formed. Said cooling ribs may also be led out of the plane of the metal plate by bending. Thereby, the preferred parallel alignment of the supply element and the discharge element to one another remains for the arrangement on a preferably plane supply element. The supply element serving as a heat sink may unilaterally surpass the support element and may there be flowed by the fluid. In case of a controller for an electric heating device in a motor vehicle, this fluid is usually air. Thereby, in particular, the air is used for cooling the power loss, which is to be heated by the electric heating device. The heat sink may also comprise recessed air passage openings in the metal plate. Said air passage openings may for example be formed by cutting the metal plate and bending of the thus formed connecting pieces in the metal plate between parallel slots in the region of the heat sink. Thus, for example cooling connecting pieces may be formed from the material of the metal plate, which are projecting the actual plane of the metal plate. The region of the connecting pieces forms an opening within the metal plate. Thereby, the connecting pieces may still be unilaterally connected to the metal plate. Thus, ribs are formed on different planes being provided one after the other in the air passage opening, said ribs being flowed by the air and serving the discharge of air.

The heat sink may as well be provided with a contact surface for abutment against a cooling body and may essentially be formed by this contact surface. Such an embodiment is in particular suitable for a controller or an electric heating device in a motor vehicle, wherein the electric heating device heats fluid and said cooling body is cooled by the fluid to be heated. By applying the heat sink to the surface of the cooling body, thus, an effective heat discharge of the controller to the medium to be heated may be achieved. Thereby, the heat sink is preferably dimensioned in a way that the SMD component in case of a long-term maximum current flow and in case of an oncoming flow of the heat sink with air does not exceed a temperature of 175° C. The oncoming flow with air, thus, occurs with an airflow, which is usually generated in an HVAC of a motor vehicle by means of the blower provided therein. The air has a temperature of not more than 80° C. The dimensioning of the heat sink for the heat discharge thereby, under the mentioned conditions, preferably is such that a power loss of the SMD component of at least 10 W, preferably 11 W may be discharged. Such a power loss is generated by the MOSFETs preferably used at present, of controllers in an electric heating device in a motor vehicle. In view of a conceivable alloying of the MOSFET, however, the heat sink is preferably dimensioned such that a power loss may be discharged, which is higher by a factor 6. In case of an alloyed MOSFET, as well, which delivers a power loss of approximately 60 to 70 W, the temperature of the supply element shall not exceed a value of 320° C.

For this purpose, the metal plate is formed of a material, which is not only electrically conductive, but also is a good thermally conductive material. This may be copper, brass, or also aluminum. In case of aluminum, usually the surface is electro-plated in order to achieve a sufficiently good electrical conduction between the aluminum metal plate and the SMD component surface-mounted thereon, despite the oxide layer provided on aluminum. For an adequately improved efficiency of the controller in view of the problem of a heating discussed herein, as for example in case of an alloying of the MOSFET, the support element is preferably produced from a thermally high-grade plastic. Examples for such plastics are PPS (polyphenylene sulfide), in particular PPS GF 40, PEEK (polyether ether ketone), in particular PEEK GF 30, PA (polyamide), in particular PA6.6 GF.

The controller according to the invention is designed with the aim to prevent a thermal incident, in which parts of the controller melt or smolder, even in case of alloying a power transistor as SMD component and in case of a maximum power loss due to this power transistor and all power transistors available. The thermoplastic material preferably forming the support element is suitable for withstanding temperatures of up to about 280° C., preferably of 320° C. without the plastic being smoldered. On the support side of the support element, where this is usually supported on the outer wall of the control housing, and regularly on the side of the support element opposite to the SMD component, ribs and connecting pieces are usually provided, which space apart the control housing from the support element so that no substantial direct thermal conduction from the high-grade plastic material of the support element to the less high-grade plastic material of the control housing can occur. The high thermal conductivity of the metal plate causes that the power loss generated by the SMD component is discharged in a particularly effective manner in the plane of the metal plate by thermal conduction and is discharged in the region of the heat sink by thermal transmission to the flowing fluid. Thus, the busbar below the SMD component may abut directly the support element, which is to be preferred in view of a solid support of the SMD component. However, it is also conceivable to provide recesses even below the support element so that by this measure, as well, a cooling, but above all, a reduced thermal loading of the plastic material directly below the SMD component, are effected.

For the effective cooling of the power loss of the SMD component, the supply element preferably forms a cooling lug directly adjacent to the SMD component. This cooling lug is exposed in the fluid stream. For this purpose, the support element usually has a window opening, in which the supply element is at least partly exposed. The supply element can surpass this window opening, i.e. extend parallel to the support element beyond the opening and, on the opposite side, can also be supported on the support element in a laminar manner. However, the supply element can also be angled in the region of the window opening and in order to form a relatively large surface parallel to the surface which is flowed by the airflow, it can extend perpendicularly to the region of the supply element, on which the SMD component is mounted. Such an embodiment offers the possibility to form the support element as part of the housing of the electric heating device or, however, to dimension said support element in such a way that it can be mounted in the control housing region of a housing of the electric heating device for a solid support of the busbars and components mounted thereon. If this support is not of importance, the cooling lug may also protrude beyond the contour of the support element.

According to a further preferred embodiment of the present invention, the support element comprises a stamping opening on the height of the severed connection piece. This stamping opening is either formed from the outset on the support element or is the result of the stamping of the metal plate and the result of a procedure, according to which the supply element region and discharge element region initially connected and secured by the connecting piece on the support element and then are electrically separated from one another by stamping or otherwise severing the connecting piece. Thereby, also the support element is provided with an opening at the height of the connecting piece. In this case, the stamping opening can be configured uniformly with the window opening. In a projection onto the support element, accordingly, an opening region in the support element occurs, in which the severed connecting piece is located, and a further region, in which the part of the supply element is located, which is configured as heat sink, wherein a uniform contour of the support element encompasses both opening regions.

Preferably, the supply element is configured as heat sink on both sides of the SMD component. This means that the two legs of the busbar protruding from the SMD component serve the heat discharge and are usually directly flowed by a cooling fluid, preferably by air. Thereby, the free end of the supply element can surpass the support element. The opposite leg, in the following also referred to as the supply-side end of the supply element, usually is free in a window opening of the support element and beyond this window opening, it is additionally supported by the support element. There, the supply-side end is usually linked to a connection for the power flow to be switched.

According to a preferred embodiment of the present invention, the initially single-part stamped metal plate contains a control current supply element, which is connected to a control current supply line of the SMD component. Said control current supply element is spaced apart via a further severed connecting piece from the supply element and/or the discharge element. Accordingly, an electric separation occurs between the control current supply element and the busbars for the power flow. Due to the production of the busbars, and the control current supply element, the control current supply element is preferably in a plane with the busbars. In view of an embodiment that is as space-saving as possible, the control current supply element is preferably located adjacent to the supply-side end of the supply element and between the discharge element and a supply side, where the supply element/s is/are electrically connected to a common supply busbar and are preferably single-part configured therewith. The control current supply element thereby is usually configured substantially narrower than the busbars themselves, transversely to the direction of extension of the busbars. It is evident that the supply element, the discharge element, and the control current supply element are regularly configured substance-identically.

The control current supply element is preferably also connected to the support element, for example with that connection technology, with which the busbars forming the supply element and/or the discharge element, as well, are connected to the support element.

According to a preferred embodiment of the present invention, the discharge element surpasses the supply element with its free end and forms with its free end a connection lug for connecting to a power component of the electric heating device. This connection lug may be configured as a single-part with a contact plate of the power component. It can be also connected to such a contact plate of the power component by soldering, crimping, or other kinds of connection so that initially, the controller according to the invention may be produced separately and subsequently electrically connected to the power component.

According to a preferred embodiment of the present invention, a further busbar metal sheet is provided, which forms a connection lug of a different polarity adjacent to a connection lug formed by the discharge element. Provided that several discharge elements with associated SMD component are provided, the connection lugs of different polarity formed by the further busbar are usually located at the same height and between the connection lugs of the discharge elements. Thus, a compact electric connection to a power component of a PTC electric unit is provided, which will be subsequently described in more detail.

The present invention further provides an electric heating device, in particular for a motor vehicle. This electric heating device has, in a manner known per se, a power component at least comprising one heat-generating layer with at least one PTC element and contact plates adjacent on both sides thereof. In addition to this heat-generating layer, a heat-emitting layer is provided. The heat-emitting layer is usually directly adjacent to the heat-generating layer. Thereby, the heat-generating layer may also comprise an insulating layer, which strips the contact plate on the outside so that the heat-generating element per se is provided in an insulating manner in the power component and that the heat-emitting layer is not supplied with current, i.e. usually is of neutral polarity or ground. In a manner known per se, the electric heating device has a control element, which is provided in a structural unit with the power component. Such an electric heating device is for example known from EP 1 157 867.

According to the invention, the previously known electric heating device has a controller according to one of the above described embodiments. This controller is component of the control element or exclusively forms the control element. Thereby, one of the contact plates of the power component are connected in an electrically conductive manner to the discharge element so that the power current switched by the SMD component is transmitted to the power component. Besides the above described controller, the control element can comprise further elements, for example a printed circuit board equipped with electrical components. Preferably, the control element, however, does not contain a printed circuit board in the actual sense, i.e. a synthetic resin structure with conductive tracks incorporated therein, on which electrical or electronic components are mounted, as the controller according to the invention is preferably producible without such a conventional printed circuit board. For switching, controlling, and conducting current, only metal pieces need to be formed, being provided stamped and insulated from one another and held by the support element, and which are configured in the form of a busbar, which are electrically connected to one another for the power supply of a first polarity solely via a SMD component. Via said metal pieces, which are stamped and produced from the initially single-part formed metal plate, exclusively the conduction of the power supply and the control current occurs.

Thus, the electric heating device can be produced simply, cost-effectively, and also in a weight-saving manner by taking into account the requirement that sufficiently capable conductive tracks with an adequate capacity for conducting high power flows are provided.

According to a preferred embodiment of the present invention, the electric heating device comprises the aforementioned further busbar forming a connection lug of a different polarity. This connection lug of a different polarity is connected to another contact plate in an electrically conductive manner so that the power supply and discharge to the power component may occur solely via the controller according to the invention. The electric heating device, therefore, can be connected from one side and accordingly easily mounted into an HVAC by inserting it into the same.

According to a preferred embodiment of the present invention, the electric heating device has a shell-like housing element, which receives the power component and the control element. Furthermore, according to this embodiment, a housing counter element is provided, which covers the shell-like housing element by embedding the power component and the control element. Thereby, at least one of the housing element and the housing counter element is provided with at least one connection opening in the region of the connection lugs in order to form a mechanical connection between the connection lugs of the controller and the linking lugs of the power component, which are adjacent thereto, after the housing has been closed by embedding the control element and the power component. The housing element and the housing counter element usually have housing window openings for each heat sink and/or cooling lug, which allow the fluid to flow through the housing and, thus, an effective convective discharge of the power loss. The housing window openings may contain connection openings. By means of a suitable mechanical connection, a good electrical, as well as a solid mechanical contact is produced between the connection lugs to be connected. This connection is usually formed in a pressing process. Precisely, the linking lugs and/or the connection lugs can be connected to one another by means of crimping, toxing, or clinching. Thereby, the connection opening is preferably configured in such a way that all contact lugs between the control element and the power component can be connected to one another by means of one unique stroke of the pressing tool. In order to embed, protect and cover the power component and the control element in the housing as best as possible, preferably for each pair of connection lugs to be connected, an associated connection opening is recessed, into which a pressing tool penetrates in order to establish the desired mechanical connection between the connection lugs. The joining region of the connection lugs is regularly provided between opposing connection openings, which are recessed in the housing element and the housing counter element. Thus, an air passage through the housing and a cooling of the joining area are possible.

The present invention offers the possibility to produce the support element by means of the housing element and/or the housing counter element. Further, the possibility is given to form the discharge element single-part with a linking lug of the power component. Said linking lug may be the free end of a contact plate being directly adjacent to a PTC element. Preferably, compared to the contact surface formed by the contact plate, the linking lug is bent by 90° to the PTC element, by means of which inserting the parts into the shell-like housing element and connecting the linking lug with the discharge element are facilitated.

In view of the method-related aspect of the present invention, a method with the features of claim 18 is proposed. Regarding the method according to the invention for the production of an electric heating device, initially, a stamped plate is produced essentially corresponding to the contour of the busbars of the controller. It goes without saying that from a larger metal plate, a plurality of such units can be stamped as pre-cut blank in one stroke. The busbars of the controller, which are associated to a polarity, and, if appropriate, also the power control supply elements, are—connected by connecting pieces—formed into a unit by means of stamping. The busbars and/or the conductive elements are regions of the metal plate. Thus, the initially single-part stamped metal plate has at least one supply element region and one discharge element region, if appropriate, also one control power supply element region. These regions are connected to one another via one, if appropriate, several connecting pieces. Thus, the initially single-part stamped metal plate can be treated well as a uniform component. In a subsequent step, the SMD component is mounted on the supply element region, usually soldered, which results in an equipped metal plate unit. Of course, a plurality of such SMD components may be provided. In addition, however, also a plug for the control current can be applied, in particular soldered, when the metal plate is equipped with the SMD component. Further, electrical contact bridges may be surface-mounted, which are regularly formed of electrically conductive stamping-bending parts. Such electrical contact bridges are in particular formed between the control current supply elements and/or regions of a controller for controlling several heating circuits. Beyond that, the equipped metal plate unit does not comprise any other or further electronic or electrical components.

Thereafter, the equipped metal plate unit is secured to a support element. The securement thereby occurs in such a way that the single functional areas per se are respectively connected to the support element. Accordingly, every supply, discharge, and, if appropriate, control current supply region is secured to the support element by itself, respectively. This securement is preferably effected by means of detent lugs, which are formed on a support element produced by injection-molding of plastic. Basically, a positive connection is preferred, which is effected between the support element and the metal plate unit. Thereby, such positive connections are to be preferred, which can be effectively produced by interlocking. The equipped metal plate unit may be as well held by means of clamps on the support element, which is for example produced from plastic. Alternatively, or additionally, also one or several warm caulking pins may protrude bores through individual or all functional areas and may lead or contribute to securement of the functional area and the support element by means of warm caulking. During the joining of the metal plate unit and the support element, or thereafter, regarding the method according to the invention, the individual functional areas are electrically separated from one another by severing the connecting pieces, which initially ensure the sheet metal continuum. Consequently, a supply element and a discharge element are produced, which are electrically connected to one another only via the SMD component. If a control current supply region is provided on the equipped metal plate unit, the connecting piece and/or pieces is and/or are also severed for this purpose in order to form this region as being a control current supply element, which is held electrically insulated per se and from the supply and discharge elements on the support element and which is electrically connected to these elements solely via the SMD component. Furthermore, in view of a mass production, the practice is preferred to arrange the pre-cut blank with its respective metal plate units in the associated support elements and to fasten it therewith, and simultaneously, to separate the respective metal plate units from the pre-cut blank. Thus, a plurality of controllers according to the invention are produced and separated from the pre-cut blank in one step. This step is usually achieved by a combined mounting and separating device, which holds the metal plate unit relative to the support element well-positioned and moves both parts towards one another in such a way that they are connected to one another and the individual conductive elements of the metal plate unit are separated from one another by severing connecting pieces.

In this manner, the position of the individual conductive elements on the support element is predetermined and fixed with a high precision. The mounting is easy, as the individual elements are initially handled in the continuum and are as such transferred to the support element and secured therewith. Only thereafter, by severing of the connecting piece and/or pieces, an electrical separation between the individual areas is established in order to form the functional elements provided in an electrically insulated manner on the support element.

BRIEF DESCRIPTION OF THE DRAWINGS

Further features, advantages and details of the present invention are derivable from the following description of an embodiment in combination with the drawing.

Therein shows.

DETAILED DESCRIPTION

Figure 1:
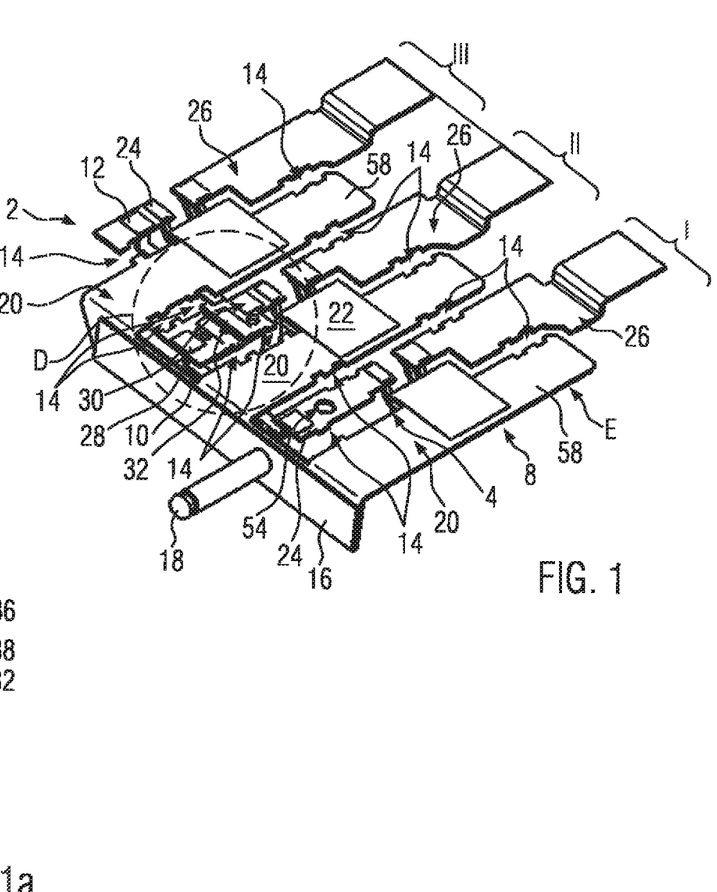
FIG. 1 a perspective top view of the underside of the conductive tracks of the embodiment.
Figure 2:
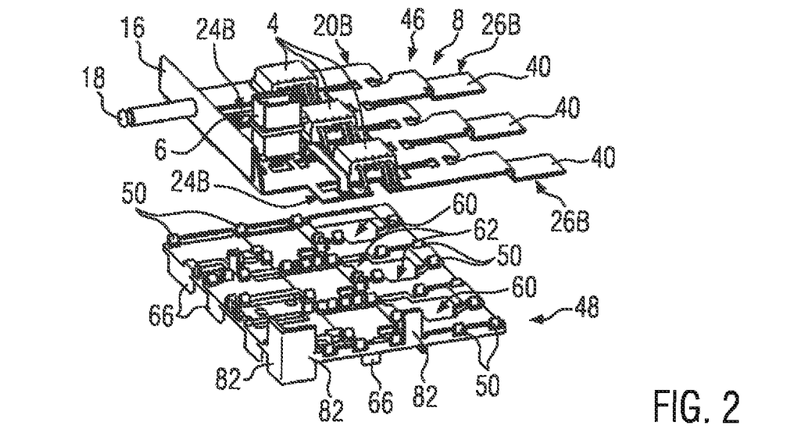
FIG. 2 an exploded perspective view with a perspective top view of an equipped metal plate unit, which approximately corresponds to the embodiment shown in FIG. 1 and to an embodiment of a support element.
Figure 3:
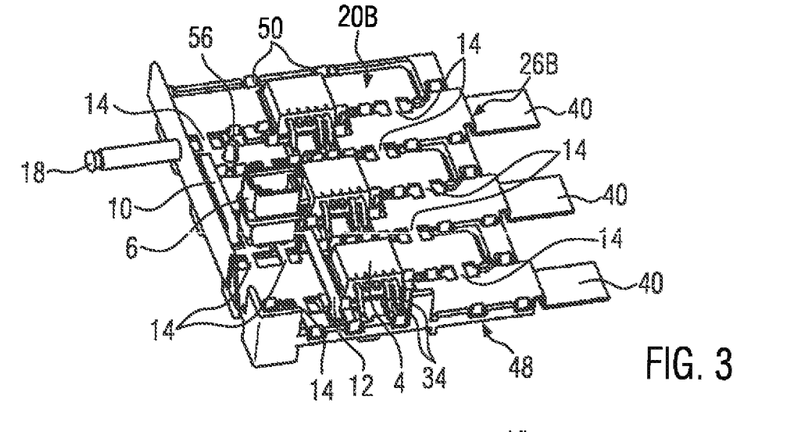
FIG. 3 a perspective top view of the elements shown in FIG. 2 after the joining and before the stamping process.
Figure 4:
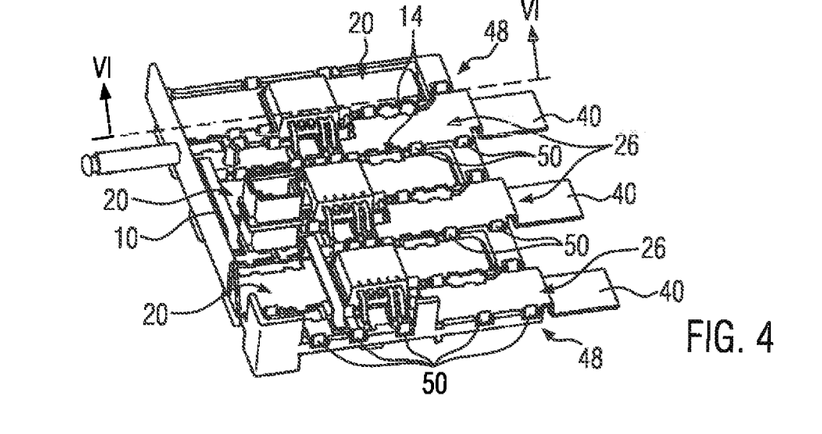
FIG. 4 a perspective top view of the elements shown in FIG. 2 after the joining and after the stamping process.

The drawing shows essentially conductive tracks of a controller as an embodiment of the present invention. The configuration becomes comprehensible in particular in combination with FIGS. 2 and 3. Thus, FIGS. 2 and 3 show an equipped metal plate unit 2, which is produced by stamping and bending from a metal plate 8 and/or a sheet metal. The metal plate is equipped with three SMD components 4, which are presently power transistors (MOSFET), as well as one plug housing 6. The SMD components 4 and the plug housings 6 are connected to a metal plate 8 in order to form the equipped metal plate unit 2 by means of soldering. Moreover, electrical contact bridges identified with reference numerals 10 and 12 are provided, which in width direction connect different stamped adjacent surface areas to one another. Regarding the metal plate unit shown in FIG. 3, different regions of the metal plate 8, which shall be discussed in more detail below, are connected to one another via connecting pieces 14. In FIG. 1, reference numerals 14 are directed to that sections, in which beforehand connecting pieces 14 of the metal plate unit 2 had been provided.

Figure 1A:
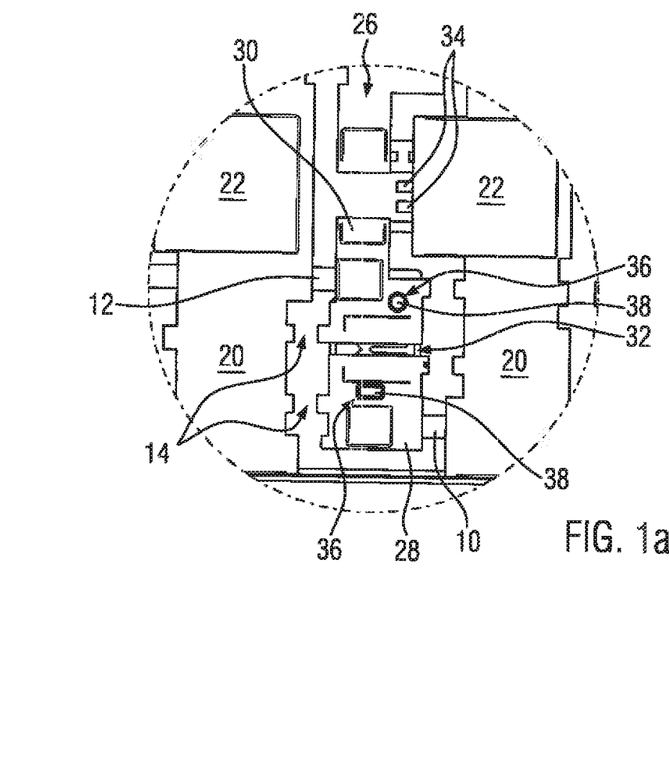
FIG. 1a the detail D according to FIG. 1 in an enlarged presentation and in a top view.
Figure 6:
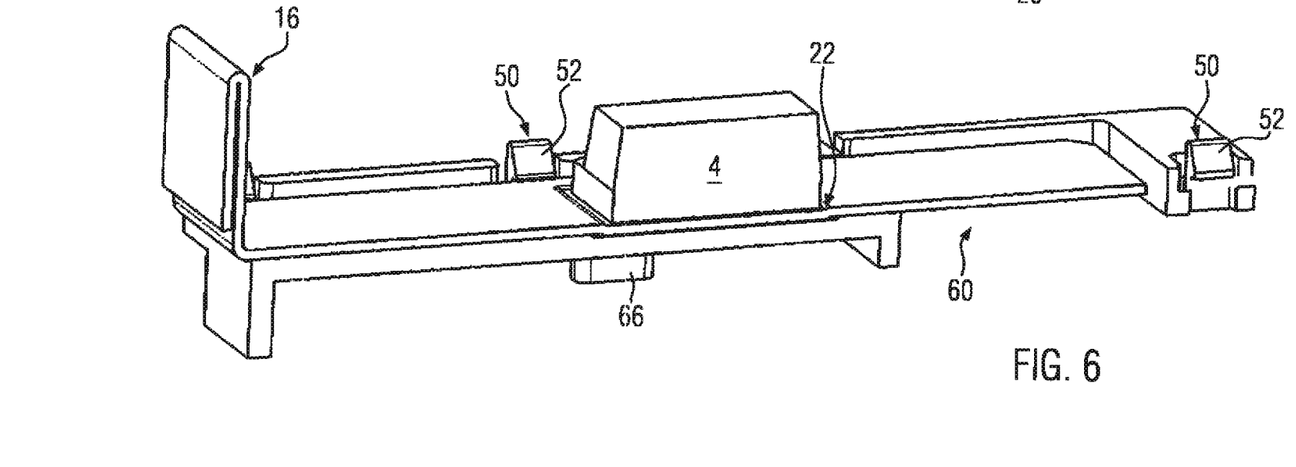
FIG. 6 an enlarged perspective sectional view along the line VI-VI according to the illustration in FIG. 3.

As evident from FIGS. 2 and 3, the metal plate 8 is produced by stamping and bending. A lead frame consisting essentially of six web-shaped configurations, which are provided parallel to one another is formed. At the rear, supply-side end of the metal plate 8, a supply busbar 16 is formed by simple folding and placing against one another of the sheet metal layer of the metal plate 8, from which a connection pin 18 protrudes, which is directly attached thereto, for example soldered. In the present case, the supply busbar 16 extends perpendicularly to the main extension direction of the metal plate 8 so that the connection pin 18 extends parallel to the metal plate 8. Such a configuration, however, is not necessary for the realization of the invention. The pin 18 may extend in any direction. The connection pin 18 thereby usually provides the plug-in direction for the electrical connection of the conduction current. By means of stamping and bending, the supply busbar 16 and, thus, the connection pin 18 can have any alignment. In a plane, which is hereinafter referred to as the current supply plane E, supply elements are located, which are directly connected to the supply busbar 16. These supply elements respectively form per se a SMD holding base 22, which is—as shown in FIG. 6—configured slightly lowered by stamping compared to the current supply plane E so that during surface mounting of the SMD component 4, the solder can be held at the predetermined location in an improved manner. The SMD holding base 22 laterally protrudes from the basically web-shaped supply element 20. Between adjacent supply elements and/or laterally next to such a supply element, nearby the supply-side, at least one control current supply element 24 is provided. A discharge element 26 is located in the extension of the control current supply element 24. For each heating circuit one single discharge element 26 and one single discharge element 20 are provided. Further, for each heating circuit, at least one control current supply element 24 is provided. The plug housing 6 is mounted on two control current supply elements 28, 30, which are from the beginning separated from one another by stamping. These are separated from one another by a slot 32, however, are held in position stabilized on the stamped single-part metal plate 8 (see FIG. 1*a*).

As illustrated by the underside perspective view according to FIG. 1, the contact points on the metal plate 8 are recessed by hobbing at every soldering joint, also for the electrical contact bridges 10, 12, as well as for the contact base 34 of the SMD component in order to hold the solder at a predetermined position. The same applies for the contact elements, which are held by the plug housing 6 and which are bonded to the two control current supply elements 28, 30. Said control current supply elements 28, 30 further comprise retaining openings 36 for receiving mounting pins 38, which protrude at the underside from the plug housing 6.

FIG. 1 illustrates that the discharge element 26 and the supply element 20 respectively are configured as a busbar by stamping and, if appropriate, by bending the metal plate 8 and are aligned parallel to one another. The discharge elements 26 surpass in the longitudinal direction of the respective busbars the associated supply elements 20, end at the same height, and are bent at right angles at their free ends in order to form a connection lug 40 lying outside but parallel to the plane E. This embodiment aims to apply the connection lugs 40 to the bottom of a housing 42 of a motor-vehicle auxiliary heating device 44, the housing 42 of which is to be further described below.

In view of a configuration being as compact as possible in the width direction, the discharge element 26 at the height of the SMD component 4, i.e. the SMD holding base 22, comprises an incision 45, which continues approximately the constant slot-like clearance between the supply element 20 and the discharge element 26. The discharge element 26 further ends at the connection side approximately at the height of the SMD holding base 22. The associated control supply element 24, as well, ends with its front end at the height of the SMD component 4 and extends in extension of the discharge element 26, however, with a distance thereto.

As apparent, in accordance with the three heating circuits I to III, three subassemblies each having a supply element 20, a discharge element 26, a control current supply element 24, and a SMD component 4 are provided, wherein the SMD components 4, which electrically connect the supply element 20 and the discharge element 26 of a subassembly, respectively, are arranged side by side, i.e. in transverse direction one after another. All supply elements 20 of the subassemblies are electrically connected to one another via the supply busbar 16.

FIGS. 2 and 3 illustrate the initially single-part configuration of the stamped metal plate 8. Said metal plate 8 comprises regions being spaced apart from connecting pieces 14 and connected via the same, which are characterized with the reference numeral B following the already mentioned individual current supply parts in order to indicate that these are the regions, which are still connected to one another in order to form the respective functional parts. The initially single-part metal plate 8 is brought into the form as evident from FIGS. 2 and 3 by stamping and bending. Thereafter, all soldering processes are carried out in order to connect the SMD components 4, the plug housing 6 with its respective contact elements, and also the electrical contact bridges 10, 12, which transmit the control signals from the elements 28 and/or 30 to the control current supply elements 24 to the metal plate 8. Regarding the shown embodiment, further soldering processes are not necessary. The above described further components applied to the metal 8 constitute of all components of the controller. Specifically, a conventionally equipped printed circuit board is lacking. Elements of the initially single-part metal plate 8, which are separated from one another, solely constitute the conductive tracks for the conduction current and the control current.

The equipped metal plate unit 2 prepared in this way is mounted to a support element 48 and connected thereto. For this purpose, the support element comprises a plurality of detent lugs 50 with associated slide surfaces 52 (see FIG. 6), which are elastically pushed outwards during applying the equipped metal plate unit 46 and which independently lie down with their interlocking surfaces 50 on the surface of the individual current conductive plate segments 20B, 24B, 26B, 28B, 30B, in order to fix them. As apparent from FIG. 1, the control current supply element 24 provided between two supply elements 20 comprises a bore 54, which is protruded through by a conical pin 56 that serves the centering and mounting.

The configuration of the bore 54 and the pin 56 secures that the support element 48 can only be joined in a predetermined manner to the equipped metal plate unit 46 and ensures the precise positioning of the busbars, in particular in the longitudinal direction.

After the support element 48 and the equipped metal plate unit 46 have been joined, all connecting pieces 14 are severed in order to insulate the conduction elements already described with reference to FIG. 1. According to that, the supply element 20 of a heating circuit I, II, III with the associated discharge element 26 is only electrically connected via the SMD component 4. This electrical connection is effected via the contact bases 34 of the SMD component, which conduct the conduction current and are surface mounted on the associated discharge elements 26. A further contact base 34 for the control current electrically connects the SMD component 4 of each heating circuit I, II, III to the associated control current supply element 24 and/or 30.

Each individual element provided for the control current and power current supply per se is sufficiently held on the support element 48 in a fixed and positioned manner by means of the detent lugs 50 and/or the pins 48. The support element 48 is configured such that the supply elements 30 are provided with their free end, which forms a cooling lug 58 as a heat sink, within the contour of the support element 48. Solely the discharge elements 25 surpass the support element 48 with their connection lug 40.

Figure 5:
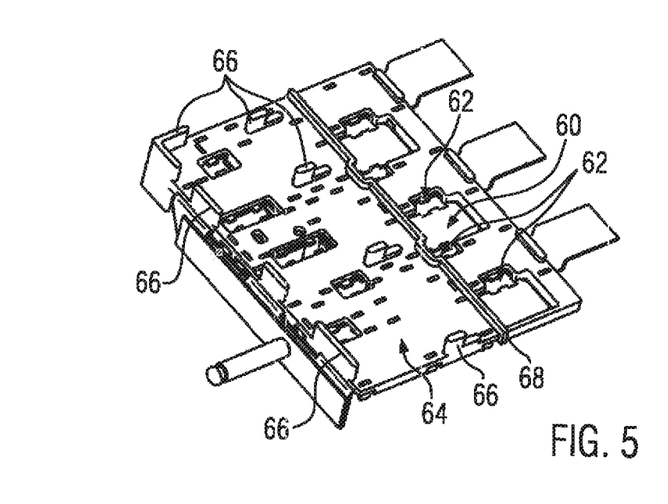
FIG. 5 a perspective underside view of the embodiment shown in FIGS. 2 and 3.

The cooling lug 58 is located in a cooling window opening 60, which is recessed in the support element 48. For each individual cooling lug 58, a corresponding cooling window opening 60 is provided. This cooling window opening 60 is in each case uniformly configured with two stamp openings 62, which place connecting pieces 14 underneath, which respectively connect supply elements 20 and discharge elements 26 in the front region of the supply elements 20 to one another (see FIG. 3). The respective stamp openings 62 are marked in FIG. 5. Further stamp openings 62 are formed on the support element 48 near the supply side in order to sever the connecting pieces 14 located there. For each of the connecting pieces 14, a stamp opening 62 is formed for a subsequent severance of the connecting pieces 14. Sometimes, larger stamp openings 62 are provided, by means of which several connecting pieces may be jointly achieved and severed. When severing the connecting pieces 14, a stamping tool on the one hand engages into the stamp openings 62 from below and acts from above against the connecting piece in order to stamp out and/or shear it. Although stamping constitutes the preferred way of severing the connecting pieces 14, they can also be severed by any other method, such as laser cutting or sawing. Stamping, however, allows a removal of all connecting pieces 14 in one stroke of a stamp, which is adapted to the arrangement of the connecting pieces and, thus, is particularly economical. Furthermore, the stroke for the stamping may also be used in order to initially join the metal plate unit in one go with the support element 48.

In the following, some details of the support element 48 are explained in more detail. Regarding the shown embodiment, the support element 48 is produced as an injection-molded component. A thermally high-grade thermoplastic, such as for example PA66 and/or PPS, is injection-molded. As illustrated by the rear side top view according to FIG. 5, a basically plate-shaped base 46 of the support element 48 is surpassed by various spacing webs 66, which serve the rather punctual support of the support element 48 against the housing 42 of the motor-vehicle auxiliary heating device 44. Thereby, a certain thermal decoupling between the thermally high-quality formed support element 48 and the housing 42 is established. In transverse direction, a separating web 68 consistently protrudes from the base 46 on the rear side, which separates the region with the cooling window openings 60 from the connection-side region of the support element 48. Thus, it is prevented that the air flowing in for cooling reaches behind the SMD components 4 at the oncoming flow side. In the present case, the oncoming flow is effected by the underside of the support element 48 shown in FIG. 5. As furthermore illustrated, the SMD components 4 in the shown embodiment are covered over the entire surface by material of the support element 48 so that even with a conceivable leakage of air, this may not directly reach the sensitive SMD components 4.

Figure 5A:
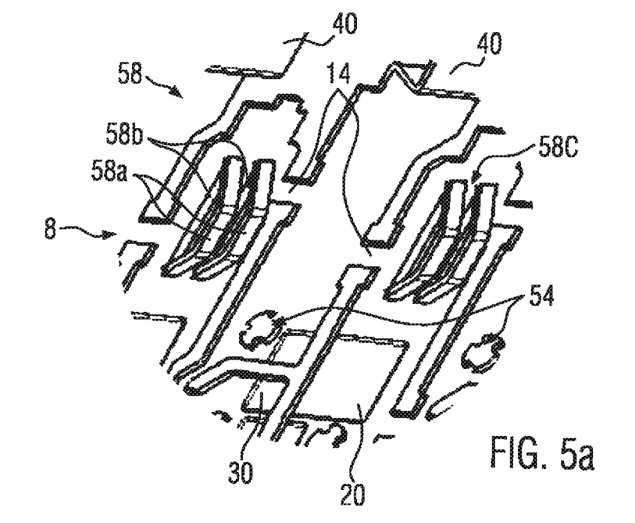
FIG. 5a a perspective top view of a region forming the cooling lug of the supply element.

FIG. 5a shows a specific configuration of the cooling lug characterized with reference numeral 58. In the region of the heat sink formed by the cooling lug 58, the sheet metal material forming the cooling lug 58 is slotted and formed for bending out webs 58a, which are shaped by slots. The webs 58a at their ends are respectively further connected to the plate material of the metal plate 8 and are respectively each lifted out of the plane of the metal plate 8 by bending. Thus, the webs 58a form cooling ribs, which cover openings 58a in the flow direction of the air flow (perpendicularly to the plate plane of the metal plate 8), through which air can flow. The region of the metal plate 8 provided between the openings 58b also forms a cooling rib 58c. By means of this configuration, the convective heat discharge in the region of the cooling lug 58 is improved. It goes without saying that the heat discharge can also be improved by other measures, which increase the surface in the region of the cooling lug 5. Thus, the metal plate 8 can also be lifted out from the plane of the metal plate 8 in the region of the cooling lug 58 in order to form cooling webs or ribs, which for example extend in flow direction of the air.

Figure 7:
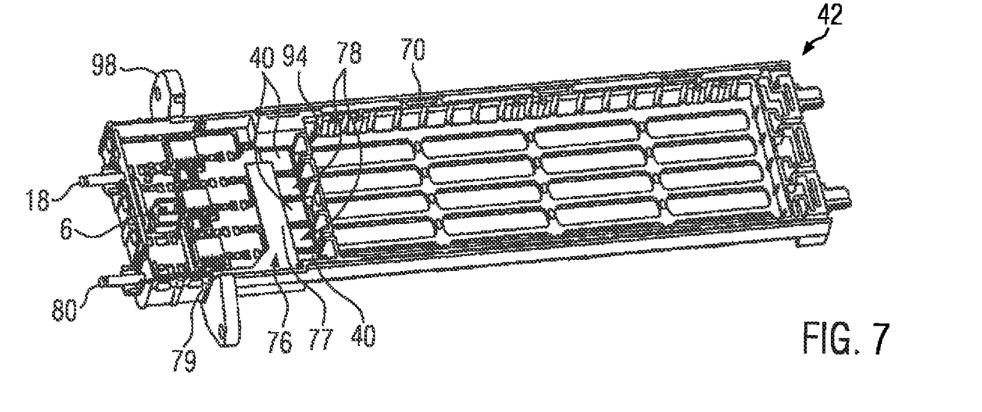
FIG. 7 a perspective top view of a housing of an electric heating device equipped with the controller according to FIGS. 1 to 6.

FIG. 7 shows the installation of the above described embodiment of the controller into a shell-shaped configured housing element 70 of the electric motor-vehicle auxiliary heating device 44, which is configured as a pure electric heating device and does not comprise water-bearing pipes. The housing element 70 comprises a receiving area for a power element 72 and a receiving area for a control element 74, which forms a control housing. In addition to the above described conductive track for the conduction of the power flow, the control element 74 contains a busbar 76 of a different polarity, which has been produced by stamping and bending, and which forms two connection lugs 78 of different polarity between the connection lugs 40 and the discharge elements 26. These connection lugs 78 of different polarity are provided parallel to the connection lugs 40, just as the connection lugs 40, flatly abut an inner surface of the housing element 70 on the inside. The connection lugs 78 of different polarity are extended via a busbar segment 77 extending in width direction laterally to a busbar string 79 applied inside against a side wall of the housing part, which is bent on the face side, there extends parallel to the face-side housing wall of the housing element 70 and is provided with a connection lug 78 of different polarity. Supporting webs 82 (see FIG. 2) protruding from the support element 48 hold the busbar string 79 of the busbar 76 in position and keep a distance to all busbars 20, 26 of the first polarity.

Figure 8:
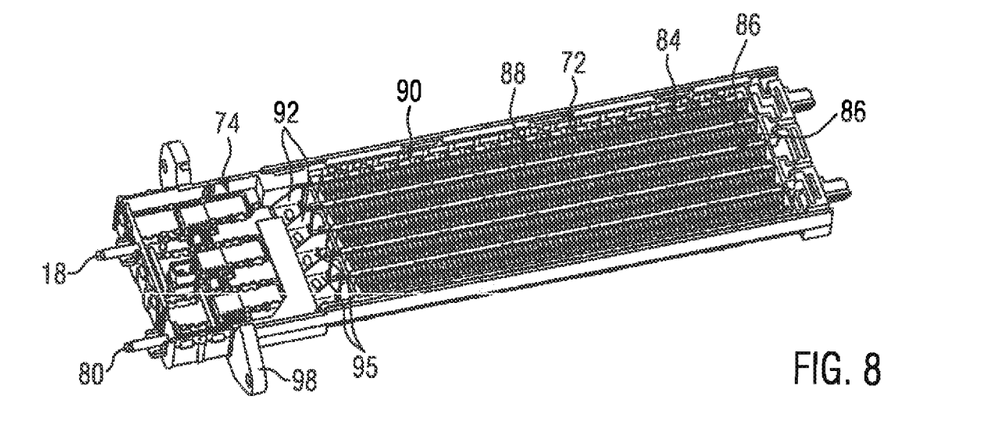
FIG. 8 the embodiment according to FIG. 7 after inserting the power component into the housing element.

As illustrated in FIG. 8, the power element 72 is formed by corrugated rib elements 84, which are provided as heat emitting layers of the power element 72. Between these corrugated ribs 84, heat generating layers 86 are arranged. The heat generating layers 86 and the corrugated ribs 84 form a heating block 88, the layers of which are applied against one another via a spring element 90. The heat generating layers 86 comprise PTC elements 91, which are accommodated between contact plates 92 and in a position frame comprising accommodations, which are adapted to the PTC elements 91 made of an insulating material for positioning the PTC elements 91. Individual contact plates 92 of the heat generating layers 86 are laterally extended beyond the heating block 88 and held in slots of a partition wall 94, which are formed by the housing lower part 70 between the power element 72 and the control element 74. These ends of the contact plates 92 extending beyond the partition wall 94 form by bending parallel to the connection lugs 40 of the first polarity and the connection lugs of the different polarity aligned linking lugs 95, which are applied to the connection lugs 40, 80.

The housing lower part 70 equipped this way is covered by a housing cover, characterized with reference numeral 96 by including the power element 72 and the control element 74.

Figure 9:
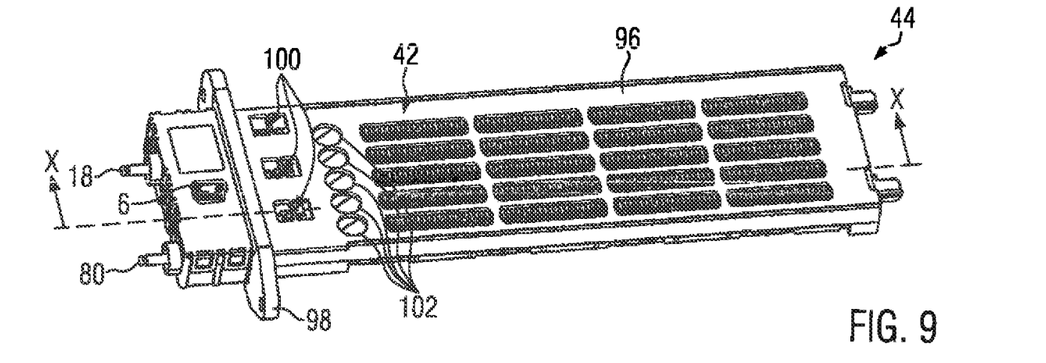
FIG. 9 the embodiment shown in FIG. 8 with the housing closed.

As illustrated in FIG. 9, this housing cover 96 comprises a recess, which is protruded by the plug housing 6 and releases the electrical connection elements provided in the plug housing 6. The connection pins 18, 86 surpass the housing 42 formed by the two housing elements 70, 96, which in the present case is formed as a two-part unit and forms a flange 98 for mounting the motor-vehicle auxiliary heating device 44 on the HVAC path. On the side opposite to the connection side, directly adjacent to the flange 98, in the housing cover 96 and corresponding thereto (not shown) on the housing shell element 70, cooling windows 100 are provided, which are recessed corresponding to the position of the cooling lugs 58 and the cooling window openings 60 of the support element 48 and which allow a passage of air through the housing 42. The housing cover 96 comprises a web 101, which is arranged adjacently to the cooling windows 100 and protrudes inside in the direction to the housing element 70, the web 101 reaching up to the support element 48 and the busbars there, and which also on this side prevents the air passing through the cooling window 100 and reaching the SMD components. As in particular illustrated in FIG. 10, the power element 72 and the control element 74 are, thus, completely enclosed in a two-part housing, wherein housing elements ensure that the control element 74 is at least partly embedded and does not come into contact with the air to be heated. The SMD components 4 accordingly abut locked and essentially sealed in the housing 42, 96, whereas the cooling lugs 58 and the connection lugs 40, 80 are exposed to the air flow to be heated.

Between the power element 72 and the cooling windows 100, there are shown five connection openings 102 arranged in a row side by side, which are provided in extension of the respective connection lugs 40, 80. Corresponding connection openings 100 are recessed on the other housing element 70. These connection openings 102 serve the engagement of the forming tool, with which the linking lugs 95 of the power element, which are placed on top of one another, aid the respective connection lugs 40 and/or 80 of the control element 74 can be connected to one another. This connection is a clinch connection. The caulking or toxing occurs usually in one stroke in order to connect all linking lugs 95 with the associated connection lugs 40, 80. The connection openings 102 further allow a passing through of air and, thus, a cooling at the phase interface between control element 74 and power element 72.

Figure 10:
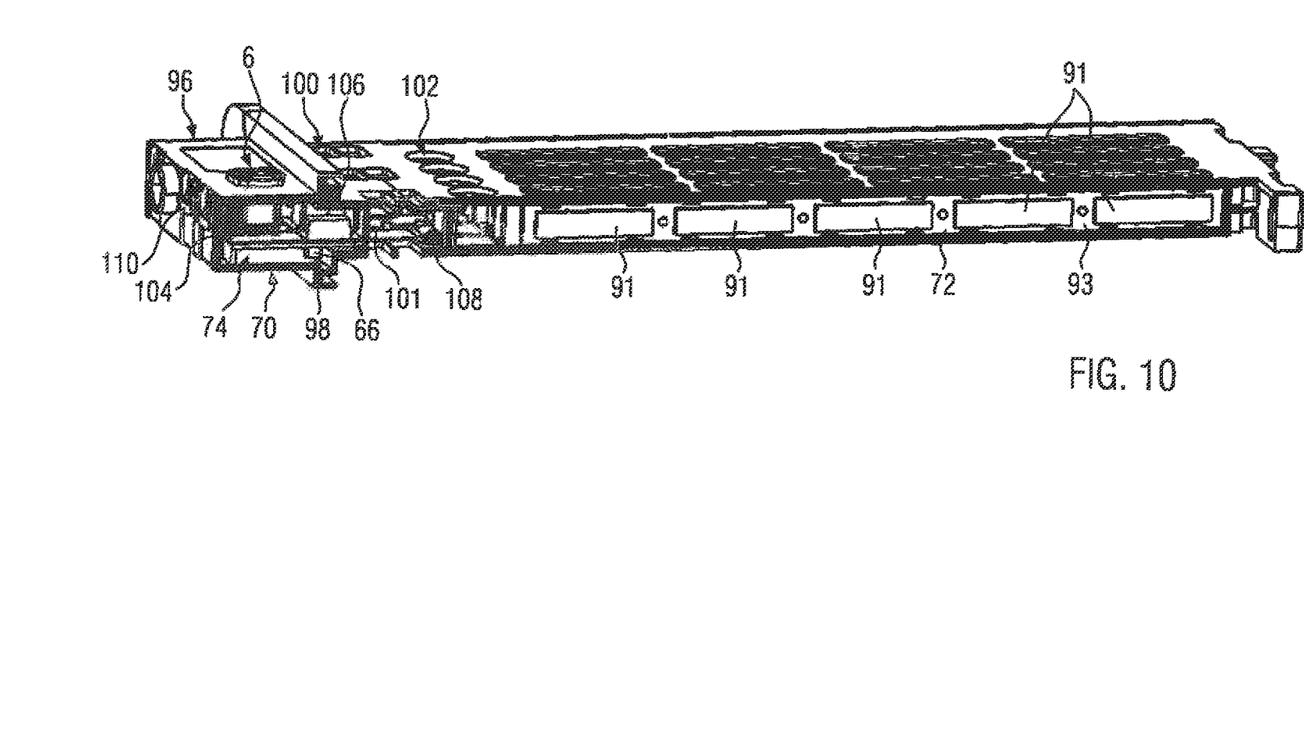
FIG. 10 a perspective longitudinal sectional view along the line X-X according to the illustration in FIG. 9.

FIG. 10 shows further details of the housing cover 96. This comprises directly adjacent to the supply busbar 16 a first connecting piece 104, which protrudes from the inner side of the housing cover 96 and forms between the outside wall of the housing lower part 70 an accommodation room for the positioning and mounting of the supply busbar 16. On both sides of the SMD component 4, second and third connecting pieces 106, 108 are provided, which may also serve as holding down clamp for elements of the control element 74. The second connecting piece 106 further establishes an insulation formed of plastic between the electrical contact bridge 12 and the SMD component 4 and accordingly extends the air gap between the two elements. The inner profiling of the housing cover 96 correspondingly serves several purposes. Thus, the creepage path and/or the air gap within a control element 74 is increased. In addition, separators and/or holding down clamps and/or positioning aids for the individual elements of the control element 74 are established by means of the connecting pieces 101, 104, 106, 108, which are formed in one piece on the housing cover 96. Thus, by means of closing the housing, the control element 74 is also mounted in a way favoring the safe function of the electric heating device. Thereby, it is sufficient for the mounting of the housing that the housing cover 74 overlaps via detent clips 110, which are integrally formed thereon, overlaps corresponding detent lugs of the housing element 70. Thus, both housing elements 70, 96 are joined to one another in a simple manner solely by interlocking.

The embodiment shown comprises three heating circuits I-III, which are respectively associated to a SMD component 4, to which associated heat generating layers 86 in the power element are associated. Thereby, the controls for the heating circuits II and III are activated in parallel so that the respective regions II and III of the power element simultaneously produce heat. However, the heating power of the heating circuits II and III can be varied by the SMD components 4. In case of a low heating power, only the heating circuit I is switched on and controlled. If a somewhat higher heating power is required, the heating circuit I is switched off and the heating circuits II and III are switched on and controlled. The switching and controlling occurs respectively only by controlling the MOSFETs. At a maximum heating power, all heating circuits I to II are active.

The present invention is not limited to the shown embodiment. Thus, a different switching of the individual heating circuits may also be achieved by the fact that for example it is dispensed with the electrical contact bridge 10. Thereby, the control current supply element 24B would be decoupled from the two other control current supply elements in a controlled manner with the consequence that the associated SMD component 4 can be controlled separately.

We claim:

1. A controller for controlling the power current of an electric heating device of an automotive vehicle, the controller comprising:
    a support element and a busbar which is secured on the support element and which conducts the power current and is connected to a power transistor which controls the power current in an electrically conductive manner, wherein
    the busbar is part of an single-part stamped metal plate with a severed connecting piece which separates the metal plate into a supply element and a discharge element, said supply and discharge elements being connected to one another in an electrically conductive manner solely via the power transistor,
    wherein the supply element comprises a stamping opening located at the height of the severed connecting piece,
    wherein the power transistor is an SMD component directly bonded electrically to the supply element, and wherein the supply element is configured as a heat sink,
    wherein the supply element is at least partly free in a window opening which is formed on the support element and is aligned with the heat sink, and
    wherein the heat sink has recessed air passage openings in the metal plate.

2. A controller according to claim 1, wherein the single-part stamped metal plate comprises a control current supply element which is connected to a control current supply of the power transistor, and wherein the control current supply element is spaced apart via a further severed connecting piece from one of the supply element and the discharge element.

3. A controller according to claim 2, wherein the control current supply element is formed by an additional busbar connected to the supply element, which additional busbar is narrower than the one of the discharge element and the supply element.

4. A controller according to claim 1, wherein the power transistor is an SMD component, wherein the supply element is web-shaped and forms a laterally projecting SMD holding base, wherein the discharge element ends at the height of the SMD component and forms an incision accommodating the laterally projecting SMD holding base, and wherein the control supply element ends at the height of the SMD component and extends in extension of the discharge element.

5. A controller according to claim 2, wherein the support element completely covers bondings of the power transistor to the discharge element or the supply element or the control current supply element.

6. A controller according to claim 1, wherein at least three subassemblies are arranged on the support element, the subassemblies including at least one supply element, one discharge element, and one power transistor, wherein the power transistors connecting the supply element and the discharge element of a subassembly to one another are arranged side by side, and wherein the supply elements of all subassemblies are electrically connected to one another via a supply busbar.

7. A controller according to claim 1, wherein a free end of the discharge element surpasses the supply element and forms a connection lug for connection to a power element of the electric heating device.

8. A controller according to claim 1, further comprising a further busbar which forms a connection lug of a different polarity adjacent to a connection lug formed by the discharge element.

9. An electric heating device for a motor vehicle with a power element, the electric heating device comprising:
a heat generating layer with at least one PTC element having contact plates adjacent thereto on both sides thereof,
heat emitting layers with the heat generating layer provided in between, and
a control element, which is provided as a structural unit with the power element, wherein
the control element comprises a controller including a support element and a busbar which is secured on the support element and which is connected to a power transistor in an electrically conductive manner, wherein the busbar is part of an single-part stamped metal plate with a severed connecting piece which separates the metal plate into a supply element and a discharge element, said supply and discharge elements being connected to one another in an electrically conductive manner solely via the power transistor, and wherein one of the contact plates is connected to the discharge element in an electrically conductive manner,
wherein the supply element comprises a stamping opening located at the height of the severed connecting piece,
wherein the power transistor is an SMD component directly bonded electrically to the supply element, and wherein the supply element is configured as a heat sink,
wherein the supply element is at least partly free in a window opening which is formed on the support element and is aligned with the heat sink, and
wherein the heat sink has recessed air passage openings in the metal plate.

10. An electric heating device according to claim 9, further comprising an additional busbar which forms a connection lug of a different polarity adjacent to a connection lug formed by the discharge element, and further another contact plate that is connected to the connection lug of a different polarity formed by the additional busbar.

11. An electric heating device according to claim 10, comprising:
a shell-shaped housing element which accommodates the power element and the control element, and
a housing counter element which covers the shell-shaped housing element by including the power element and the control element,
wherein at least one of the housing element and the housing counter element forms at least one connection opening in a region of the connection lugs for producing a mechanical connection between the connection lug of the control element and a linking lug of the power element, which is adjacent thereto.

12. A controller for controlling a power current of an electric heating device for an automotive vehicle, the controller comprising:
a support element, the support element being electrically insulating, the support element having a stamp opening;
a busbar secured to the support element, the busbar being configured to conduct a power current; and
a power transistor connected to the busbar, the power transistor being configured to control the power current in an electrically conductive manner,
wherein the busbar comprises a supply element and a discharge element,
wherein the stamp opening is configured to allow a connecting piece of the busbar joining the supply element and the discharge element to be severed when the busbar is secured to the support element,
wherein the supply element and the discharge element are connected to one another in an electrically conductive manner solely via the power transistor when the connecting piece is severed,
wherein the supply element comprises a stamping opening located at the height of the severed connecting piece,
wherein the power transistor is an SMD component directly bonded electrically to the supply element, and wherein the supply element is configured as a heat sink,
wherein the supply element is at least partly free in a window opening which is formed on the support element and is aligned with the heat sink, and
wherein the heat sink has recessed air passage openings in the metal plate.

13. A controller according to claim 12, wherein the power transistor is a MOSFET which delivers a power loss of at least 10 Watts.

* * * * *